United States Patent [19]
Cunningham

[11] Patent Number: 5,557,126
[45] Date of Patent: Sep. 17, 1996

US005557126A

[54] THIN-FILM TRANSISTOR AND METHOD FOR FORMING THE SAME

[75] Inventor: James A. Cunningham, Saratoga, Calif.

[73] Assignee: SGS-Thomson Microelectronics, Inc., Carrollton, Tex.

[21] Appl. No.: 316,633

[22] Filed: Sep. 30, 1994

[51] Int. Cl.$^6$ .................................................. H01L 29/76
[52] U.S. Cl. ........................... 257/332; 257/67; 257/330; 257/347; 257/401; 257/622; 437/40; 437/225; 437/235
[58] Field of Search ............................. 257/67, 332, 330, 257/347, 401, 622; 437/40, 225, 235

[56] References Cited

U.S. PATENT DOCUMENTS

| | | | |
|---|---|---|---|
| 5,135,888 | 8/1992 | Chan et al. | 437/186 |
| 5,187,114 | 2/1993 | Chan et al. | 437/52 |
| 5,204,279 | 4/1993 | Chan et al. | 437/47 |
| 5,334,862 | 8/1994 | Manning et al. | 257/332 |
| 5,416,346 | 5/1995 | Nagakawa et al. | 257/67 |

OTHER PUBLICATIONS

Murakami, Shuji et al., "A 21 mW 4Mb CMOS SRAM for Battery Operation," *IEEE ISSCC*, 1991, pp. 46–47, Jan.

Ishibashi, Koichiro et al., "A 1V TFT–Load SRAM Using a Two–Step Word–Voltage Method", *IEEE ISSCC*, 1992, pp. 206–207, Jan.

Sasaki, Katsuro et al., "A 7ns 140mW 1Mb CMOS SRAM with Current Sense Amplifier," *IEEE ISSCC*, 1992, pp. 208–209, Jan.

Goto, Hiroyuki et al., "A 3.3V 12ns 16Mb CMOS SRAM," *IEEE ISSCC*, 1992, pp. 216–217, Jan.

Liu, C. T. et al., "High Reliability and High Performance 0.35 μm Gate–Inverted TFT's for 16 Mbit SRAM Applications Using Self–Aligned LDD Structures," *IEEE IEDM*, 1992, pp. 823–826, Jan.

Hayden, J. D. et al., "A High–Performance Quadruple Well, Quadruple Poly BiCMOS Process for Fast 16 Mb SRAMs", *IEEE IEDM*, 1992, pp. 819–822, Jan.

Mead, Carver and Lynn Conway, *Introduction to VLSI* *Systems*, Reading, MA, Addison–Wesley, 1980, Jan.

Primary Examiner—Edward Wojciechowicz
Attorney, Agent, or Firm—David V. Carlson; Lisa K. Jorgenson

[57] ABSTRACT

A transistor is formed on a substrate of dielectric material. The transistor includes a layer of semiconductor material that is formed on the substrate and has a source region and a drain region. The layer also has a channel region that is in a recess of the substrate and adjacent to the source and drain regions. The channel is self-aligned, as are the light doped source and drain regions.

19 Claims, 3 Drawing Sheets

THIN-FILM TRANSISTOR AND METHOD FOR FORMING THE SAME

TECHNICAL FIELD

The present invention relates generally to semiconductor devices and more specifically to a transistor formed from a film of semiconductor material on a dielectric substrate for use in an SRAM memory cell.

BACKGROUND OF THE INVENTION

Thin-film transistors (TFTs) are often used to produce integrated circuits having reduced areas. For example, a TFT may be used as the P-channel transistor in a six 6-transistor static random access memory (SRAM) cell. A P-channel polysilicon transistor in a six transistor SRAM cell is well known in the prior art, see U.S. Pat. Nos. 5,135,888; 5,187,114; and 5,204,279; each of which are incorporated herein by reference.

Typically, a TFT is a field-effect transistor (FET) having its channel, drain, and source regions formed from a strip of semiconductor material, such as polysilicon, that has been formed on a dielectric substrate, such as $SiO_2$, quartz or glass. Thus, unlike a conventional FET that is formed in a semiconductor substrate, a TFT may be formed in a stacked arrangement, above a semiconductor structure, such as the other transistors in an SRAM cell. Such stacking of integrated-circuit components often provides a significant reduction in the area of the integrated circuit. Murakami et al. teach a stacked transistor SRAM cell in their article titled "A 21 mW CMOS SRAM for Battery Operation," ISSCC, pg. 46 (1991) presented on behalf of Mitsubishi Electric.

However, a TFT is often larger than its single-crystal counterparts, i.e., transistors in a single-crystal semiconductor substrate. Additionally, the switching speed of a TFT is often too slow for certain applications.

SUMMARY OF THE INVENTION

According to principles of the present invention, a transistor is formed on a dielectric layer. The dielectric layer is preferably an oxide layer overlaying integrated circuit elements in a silicon substrate. The transistor includes a layer of semiconductor material that is on the surface of the dielectric layer and has a source region and a drain region. The channel region is positioned between the source and drain regions and is within a recess of the substrate, below the surface. A gate electrode is in substantial alignment with the channel. An insulator separates the channel and the gate electrode. Because the gate electrode and the channel are self-aligned, the channel length can be precisely formed and is less than gate electrode width and twice the insulator thickness. In another aspect of the invention, the source region includes lightly doped source and drain regions that are adjacent to the channels that are automatically formed according to the invention without additional process steps and with one less step that is normally required in the prior art.

One advantage of the invention is that the transistor is smaller than existing TFTs.

Another advantage is that it is easier to manufacture than existing TFTs.

DETAILED DESCRIPTION OF THE INVENTION

Figure 1:
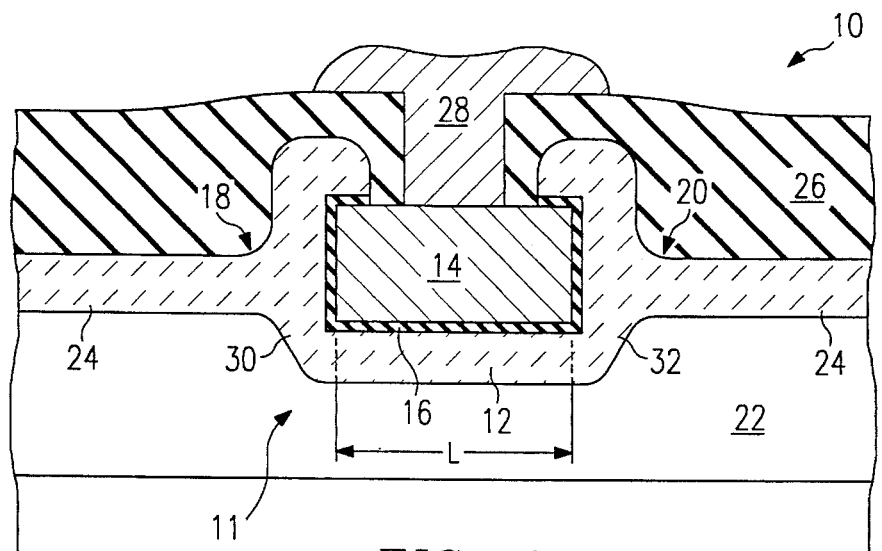
FIG. 1 is a cut-away end view of a semiconductor structure formed according to the present invention.

FIG. 1 is a cut-away cross-sectional view of a semiconductor structure 10, which in the illustrated embodiment includes a thin-film transistor (TFT) 11. As shown, TFT 11 has a channel region 12 that has a length L and is self-aligned with the gate electrode 14. That is, channel region 12 has substantially the same length as the width w of gate electrode 14.

Such self-alignment both reduces the size of TFT 11 over existing TFTs, and reduces parasitic capacitances, such as the Miller capacitance, that may be caused by gate electrode 14 extensively overlapping the source and drain regions 18 and 20, as may occur in existing devices. Thus, self-alignment of gate electrode 14 and channel region 12, as incorporated into the structure of the polysilicon transistor of the present invention, reduces the size of TFT 11.

As shown, TFT 11 is formed on a substrate 22, which is typically formed from a dielectric material, such as $SiO_2$, a glass layer, or quartz. A layer 24 of semiconductor material, typically polysilicon, is formed over substrate 22 and includes channel region 12 and drain and source regions 18 and 20. An insulating dielectric layer 26 may be formed above the polysilicon layer 24 to insulate polysilicon layer 24 from later layers, such as a gate-electrode contact 28. In one aspect of the invention, source region 18 may include a lightly doped source region 30 and drain region 20 may include a lightly doped drain region 32. These LDD regions are formed in a single implant step with the drain and source regions according to one embodiment of the present invention, as explained herein.

In one embodiment of the invention, semiconductor structure 10, which includes TFT 11 and substrate 22, may be formed over a SRAM cell 34. In such an embodiment, the TFT 11 is the P-channel device for a six transistor SRAM cell. By forming TFT 11 vertically above rather than in the substrate with other transistors in the SRAM cell, the area of the SRAM cell may be greatly reduced over existing cells that use P-channel transistor devices that are formed on the same horizontal plane as the SRAM cell. This P-channel transistor may directly replace the P-channel transistors of current six-T SRAM design, such as those previously cited herein and provide an overall smaller area memory cell size than these prior art devices.

Figure 2:
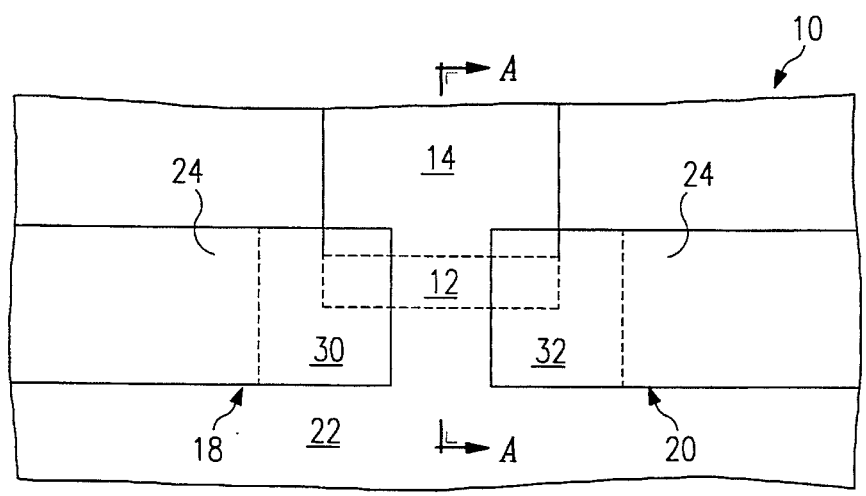
FIG. 2 is a top view of a portion of the structure of FIG. 1.

FIG. 2 is a top view of the semiconductor structure 10 of FIG. 1. For clarity, contact 28 and insulating layer 26 are omitted from FIG. 2. This shows the polysilicon layer 24 having the source/drain 18 and 20 and the channel 12 formed therein. The gate 14 overlays the channel region 12.

Figure 3:
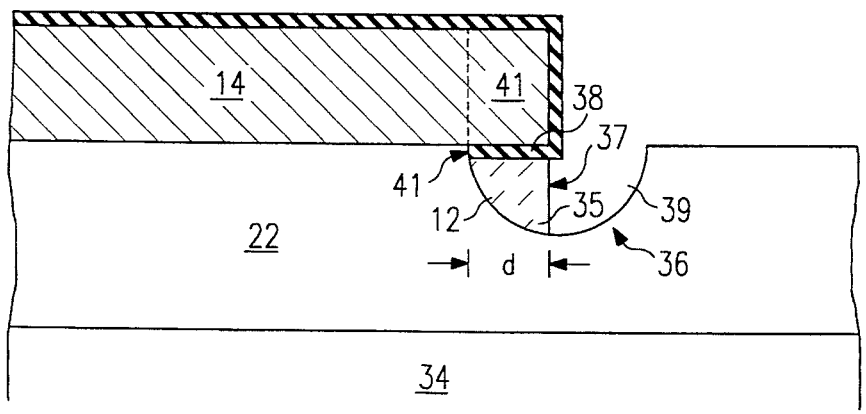
FIG. 3 is a cut-away side view of the structure of FIG. 2 taken along lines A—A of FIG. 2.

FIG. 3 shows a cut-away side view of semiconductor structure 10 taken along lines A—A of FIG. 2. Again for clarity, insulator 26 and contact 28 are omitted from FIG. 3. As shown, channel region 12 is formed in a portion of recess 36 in substrate 22. An oxide layer 38 is formed between channel 12 and the gate electrode 14. A portion 39 of the recess 36 does not have a channel region therein. As shown, a portion 41 of gate electrode 14 extends beyond an edge 41 over the recess 36 to overlay and be contiguous with channel region 12. This portion 39 is filled with the same polysilicon layer 24 in one embodiment, but because of its spacing from the gate electrode 14, it does not effectively function as a part of channel region 12. Alternatively, the portion 39 may be void or filled with an insulating structure such as $SiO_2$ or the like.

FIGS. 4–12 together illustrate a method for forming semiconductor 10, which includes TFT 11 formed on substrate 22. For clarity, SRAM 34 is not shown, it being understood that structure 10 may be formed over SRAM 34 or may be formed independently thereof, the design rules and SRAM cell layout being design choices by those of skill in the art of the many possible choices.

Figure 4:
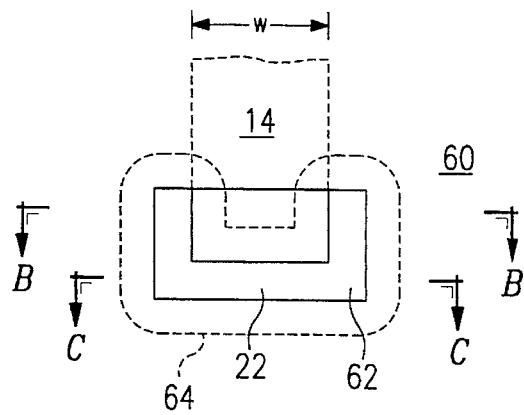
FIG. 4 is a top view of a semiconductor structure that has been etched.

Referring to FIG. 4, after the formation of dielectric substrate 22 usually formed of an $SiO_2$ layer over a silicon substrate, gate electrode 14 is formed thereon. In one aspect of the invention, a film of polysilicon having a thickness of approximately 0.5 μm is deposited upon substrate 22 by a low-pressure chemical vapor deposition (LPCVD). The polysilicon film is then doped according to existing methods to become more conductive. For example, the polysilicon film may be doped N+. After the film is doped, it is formed into a gate electrode 14 using existing photolithographic techniques. In one aspect of the invention, width W is approximately 4λ, where λ is the minimum process dimension.

Next, a mask layer 60, which in one embodiment of the invention is a layer of photoresist film, is deposited over strips 14. An opening 62 is formed in layer 60 such that it provides an opening over an end portion of the strip 14.

Figure 5:
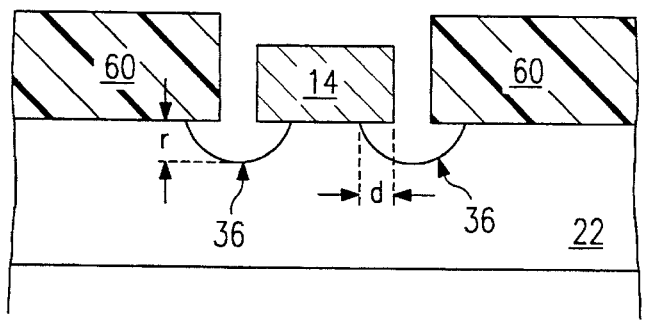
FIG. 5 is a cut-away end view of the structure of FIG. 4 taken along lines B—B of FIG. 4.
Figure 9:
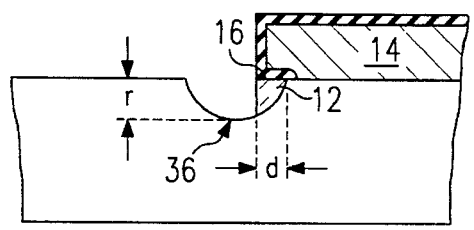
FIG. 9 is a partial cross-sectional view of FIG. 8, taken along lines C—C.

Next, the exposed regions of substrate 22 are isotropically etched to give an undercut region as shown by dotted line 64. For example, where substrate 22 is $SiO_2$, this isotropic etch is performed using an aqueous solution of dilute hydrogen fluoride (HF), such as buffered oxide etch (BOE), and is continued until the exposed regions of substrate 22 are etched to a desired depth r. In one embodiment, this depth r is approximately λ, though any depth that gives suitable etching below the poly gate electrode 14 to provide an undercut is acceptable. It may, for example, be approximately 0.5 μm or, in the case illustrated where w=4λ, to a depth of approximately 1λ, to provide an undercut distance d of approximately λ, as shown in FIGS. 5 and 9. Alternatively, d could be smaller, such as λ/2 if desired.

FIG. 5 shows a view of the structure of FIG. 4 taken along lines B—B. As shown in FIG. 5, the structure includes photoresist 60, strip 14, and recess 36, which has been formed by the isotropic etch described above in conjunction with FIG. 4. The etch produces an undercut of distance d under the gate electrode 14.

Figure 6:
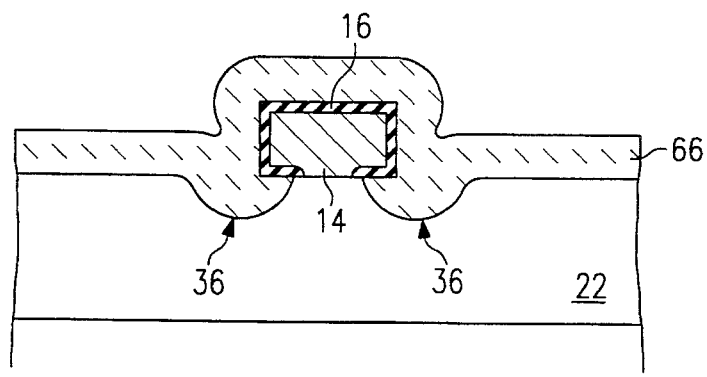
FIG. 6 is the structure of FIG. 5 after a dielectric and a semiconductor layer have been formed.

Next, referring to FIG. 6, photoresist 60 is removed according to existing techniques and gate insulator 16 is formed. The gate insulator is formed by any acceptable technique. In one aspect of the invention, gate insulator 16 is an oxide that is grown in dry $O_2$ over the exposed surface portions of strip 14, or other thermal oxidation techniques, as are known. Gate oxide 16 may have a thickness in a range of approximately 100–500 Å. The oxide 16 is formed on all exposed portions of the gate electrode in a single step. The oxide layer on the top of the gate electrode 14, on the sidewalls, and on the bottom, are all formed simultaneously. A process advantage is obtained by forming a gate sidewall oxide in the same step as the top oxide layer and the lower gate oxide on the bottom side of the gate electrode.

Still referring to FIG. 6, a semiconductor film 66 is formed on insulator 16 and on the exposed surface regions of substrate 22, including those within recess 36. In one aspect of the invention, semiconductor film 66 is formed from a layer of amorphous silicon that is deposited over substrate 22 and insulator 16 to a thickness of approximately 7,000 Å. Alternatively, the layer 66 is polysilicon of a suitable thickness. A variety of techniques for forming amorphous silicon and polysilicon are known in the art and any suitable techniques may be used as selected by the process designs as being compatible with the process.

Figure 7:
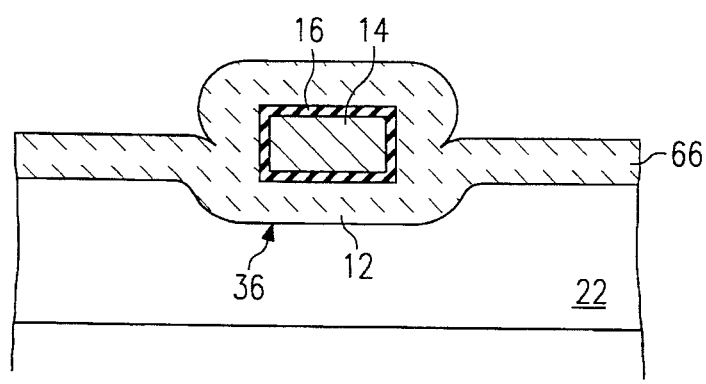
FIG. 7 is a view of the structure of FIG. 6 taken along lines positioned at C—C of FIG. 5.

FIG. 7 is a view of the structure of FIG. 6 taken along lines C—C of FIG. 4. As shown, the gate electrode 11 extends over the recess 36 to overlay a portion of film 66 that is within recess 36. This will later form the channel region 12 of the transistor.

Figure 8:
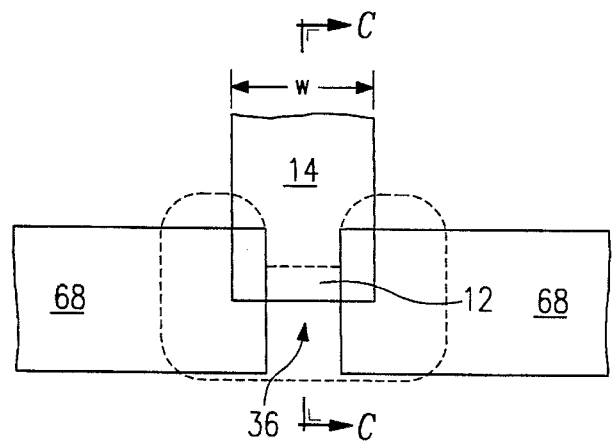
FIG. 8 is a top view of the structure of FIG. 7 with a mask layer in place and after an etch step.

Referring to FIG. 8, a second mask layer 68 is formed over film 66 to permit etching of strip 24 using standard, existing photolithographic process. The photoresist 68 is partially removed to create an aperture 69 and leave a layer 68 on top of the portions of the semiconductor layer 66 that will become the source and drain region of the semiconductor strip 24. Next, the exposed portions of semiconductor film 66 are anisotropically etched to form channel region 12 in recess 36 as shown in FIG. 9. In one aspect of the invention, the exposed portions of film 66 are etched using an ion-assisted plasma etching process. Where the resulting TFT 11 is to be used as a load device, channel 12 should be made to provide a sufficiently high resistance when TFT 11 is in an off state, i.e., when channel region 12 is in a nonconductive state. In the embodiment in which the device 11 is used as an active P-channel transistor in a six-T SRAM cell, the off-resistance is extremely high, at or above the teraohm 50 range, that from a practical circuit view it approaches infinity and the on-resistance is quite high, usually in the mega-ohm or higher range. As a P-channel transistor, it does switch on, but is not designed to be a high current carrying member when on; rather, it is designed to be conductive but to have a very low current, because of a very high channel resistivity when on.

FIG. 9 shows the device partially formed with the channel region 12 having a dimension d corresponding to the undercut depth d and a total maximum height equal to the depth r of recess 36. The channel region 12 is thus a narrow strip having a length L approximately equal to width of the gate electrode 14, a depth that can be, at maximum, the depth of the recess 36, and thickness that is, at maximum, the undercut distance d. The distance d and recess depth r may be less than the minimum feature size λ because they are formed from etch steps and undercut etches, not by standard photolithographic techniques. The channel 12 can thus be very small in these critical dimensions, as compared to prior art devices, and yet the forming steps insure that the channel 12 itself will not be overetched or discontinuities occur because the poly layer 14 protects the channel 12 from an anisotropic etch. Overetching of the film 24 will not risk harming the channel 12 because it is under the overhang 41 of the gate electrode 14. This can produce significant advantages in the process control steps not possible with prior art polysilicon film transistors, particularly if the end use is for an SRAM.

Figure 10:
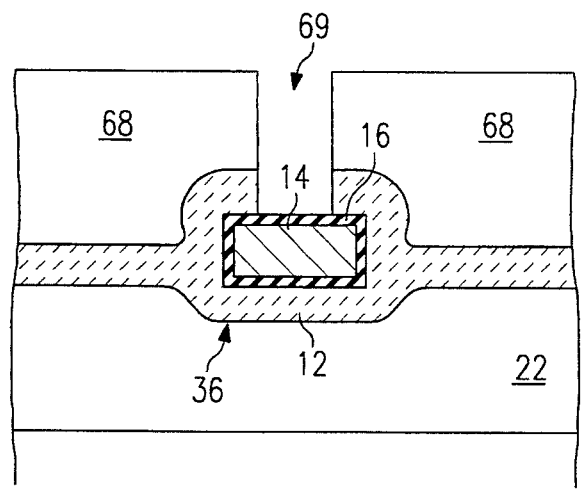
FIG. 10 is an end view of the structure of FIG. 9 taken along lines C—C of FIG. 5.

FIG. 10 is as view of the structure of FIG. 8 taken along line C—C of FIG. 4 after the above-described anisotropic etching process. After channel region 12 has been formed, it is ion-implanted to adjust the threshold voltage and form the desired type of device, i.e., either P-channel or N-channel. For example, in one aspect of the invention, a P-channel device is formed by phosphorous-ion implanting channel 12 in a range of approximately $10^{12}$ atoms/cm$^2$. The energy of this ion implant is selected such that it can penetrate the overlying strip 14. An adequate implant energy for this is approximately 300 KeV. Alternately, one may use a much lower energy and ion implant channel 12 at an angle, such as by using a rotating wafer technique or another equivalent technique that will provide access to the exposed boundary or edge 37 (FIG. 3) of channel region 12. By having the same mask in place for both the etch of the channel region 12 and the implant of the channel, self-alignment of the channel is obtained. Alternatively, one could remove the photoresistor 68 and perform a blanket implant of a light dose of a first conductivity type and overcome this by counter doping the source and drain regions.

Still referring to FIG. 10, after the implant of dopants into the channel region 12, photoresist layer 68 is removed according to existing techniques and if the layer 66 is amorphous silicon, it is crystallized, i.e., convened into polysilicon strip 24 (FIG. 1). In one aspect of the invention, layer 66 is exposed to a long, low temperature anneal in $N_2$ or Ar in order to convert the amorphous silicon into strip 24 of large grained polysilicon. Such an anneal is typically performed within a temperature of approximately 475°–600° C. for a time period in a range of approximately 20–100 hours. The anneal temperature should be low enough so that additional nucleation sites or small crystals are not generated in the amorphous silicon, but high enough so that existing crystallites may grow through solid state diffusion to produce grain sizes of approximately 5 μm and larger. Alternatively, layer 66 may be converted into strip 24 of large grain polysilicon using existing laser techniques. It is known that larger crystal grains within polysilicon layer 24 often produce improved TFTs, because larger grains reduce the number of charges that may be stored at carrier traps, which are primarily located at the grain boundaries. Alternatively, the layer 24 can be formed initially of acceptable polysilicon and the process continue without need for a long-term anneal.

Figure 11:
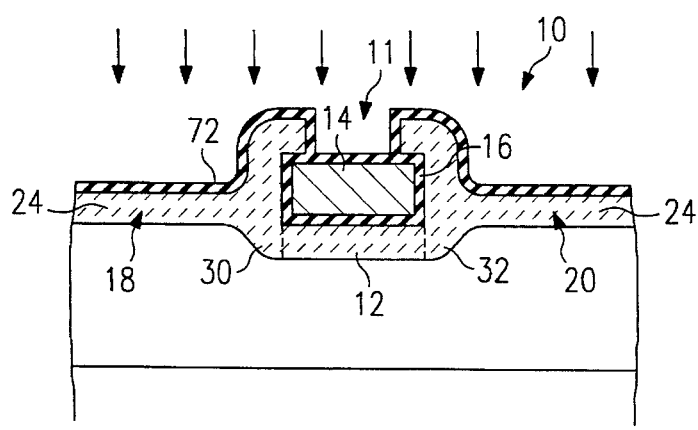
FIG. 11 is a view of the structure of FIG. 10 after the removal of the mask layer and the addition of a dielectric layer.

Referring to FIG. 11, an oxide 72 is formed over the exposed portions of strip 24. In one aspect of the invention, the FIG. 11 structure is lightly oxidized in steam at a temperature of approximately 850° C. to grow a layer 72 of silicon dioxide that is approximately 200 Å thick.

Next, structure 10 is blanket ion implanted to form drain and source regions 20 and 18. In one aspect of the invention, where TFT 11 is to be a P-channel device, structure 10 is ion implanted with boron using a dose of approximately $10^{15}$ atoms/cm$^2$ at an energy of approximately 150 KeV or possibly an even higher dose. Such an implant is made in a substantially perpendicular direction to the surface of structure 10, as shown by the multiple arrows in FIG. 11. Furthermore, such an implant provides a sufficient heavy dopant concentration for good conductivity in the portions of source 18 and drain 20 outside lightly doped regions 30 and 32 an impurity concentration of approximately $10^{19}$ atoms/cm$^3$.

Immediately after the implant process, very little boron is present in LDD regions 30 and 32. This is because it has a larger volume and also because it is protected in part from the thickness of the poly two layer, the poly one layer and the sidewalls of the gate oxide 16. Structure 10 is then submitted to a heat treatment of approximately 1 hr in a temperature range between 900°–925° C. to drive a light concentration of the implanted boron into regions 30 and 32 such that near the boundaries with channel region 12 (which in this aspect of the invention is doped N–) the impurity concentration is in the range to $10^{17}$–$10^{18}$ atoms/cm$^3$ or even less in some embodiments. Such a heat treatment forms LDD regions 30 and 32 of the P- type. Alternatively, RTA methods may be used for the boron drive-in step.

The lightly doped source and drain regions are advantageously created without an additional ion implant step. This is possible because, among other things, the layer 24 is thicker at the source/drain regions immediately adjacent the channel and also because the source/drain regions are much deeper adjacent the channel, the channel 12 being in a recess below the surface. Thus, for the same implant dose, the ions are spread over a larger volume when diffused and the final impurity concentration is less. Further, for an ion dose at the surface, the ions diffuse downward. The deeper regions of the poly layer 24 can have a lower final concentration of dopants by selective control of the thermal steps occurring after the ion implant, taking into account the impurities' diffusion characteristics. This is to be compared to prior art LDD structures that have the channel at the surface and the same volume in the source/drain regions near the channel as spaced from the channel. Such prior art devices require a separate ion implant step to create the LDD structures, but, according to this invention, the LDD structure is self-created.

The source/drain and LDD structure are automatically self-aligned to the channel 12 because the poly one layer 14 and gate oxide 16 having sidewalls surrounding this layer will act as a self-aligning edge stop to the ion implant that, when diffused, creates the LDD structure. The oxide sidewalls provide a stop for the vertical ion dose implant, being a good mask edge and the gate oxide prevents later diffusions from placing excessive counter dopants in respective polysilicon layers.

While one embodiment relies on both increased volume and greater depth of the channel to self-create the LDD structures, either could be present alone and be useful to achieve this purpose. The self-alignment of the LDD structure is also attainable by use of either of these techniques alone, or in combination.

Still referring to FIG. 11, TFT 11 may be hydrogen passivated to reduce the trap density at the grain boundaries within layer 24. Such a reduction often reduces the threshold voltage and subthreshold leakage currents. This hydrogen passivation may be performed using a long bake in forming gas or hydrogen (H), applying plasma etch chemical vapor deposition (PECVD) silicon nitride layers, immersing structure 10 in a hydrogen plasma at a temperature of approximately 300° C., or by high dose ion implantation with protons.

Still referring to FIG. 11, in one aspect of the invention the ratio of the width to the length (W/L) of channel region 12 is approximately equal to $\lambda \div 2\lambda = \frac{1}{2}$. TFT 11 may now be completed and integrated with other devices by adding appropriate insulating layers, contacts, vias and metal films, as is known in the art, a final product being shown in FIG. 1.

From the foregoing it will be appreciated that, although specific embodiments of the invention have been described herein for purposes of illustration, various modifications may be made without deviating from the spirit and scope of the invention. Accordingly, the invention is not limited except as by the appended claims. Although a method for forming a P-channel TFT 11 is disclosed, one may form TFT 11 as an N-channel without departing from the spirit and scope of the invention. While gate electrode 14 and film 66 have been described as poly one and poly two, this does not require a particular sequence of these two layers, unless the claims so specify. Further, the layers may be poly two, three or four, the particular level of polysilicon not being critical to the invention. Additionally, strip 14, which forms the gate electrode of TFT 11, may be formed from an electrically conductive material other than polysilicon.

I claim:

1. A semiconductor structure, comprising:

a dielectric substrate having a surface and having a recess formed therein, said recess having a sidewall;

a layer of semiconductor material disposed on said surface and in said recess, said layer defining a source region, a drain region, and a channel region that is entirely within said recess, is contiguous with said sidewall, and is between and contiguous with said source and drain regions;

a gate electrode disposed on said surface of said substrate and substantially outside of said recess, said gate electrode having an end portion that extends beyond said sidewall of said recess and that is adjacent to said channel region; and an insulator layer disposed between and contiguous with said end portion of said gate electrode and said channel region.

2. The structure of claim 1 wherein a first portion of said source region and a first portion of said drain region are disposed within said recess, and a second portion of said source and a second portion of said drain are disposed on said surface of said substrate and outside of said recess.

3. The structure of claim 1 wherein said source region includes a lightly doped source region that is contiguous with said channel, and wherein said drain region includes a lightly doped drain region that is contiguous with said channel.

4. The structure of claim 3 wherein at least a portion of said lightly doped source region and a portion of said lightly doped drain region are disposed within said recess.

5. The structure of claim 1 wherein said gate electrode has a pair of opposing sides that are substantially perpendicular to said surface of said substrate and that have said insulator layer disposed thereon, wherein a portion of said source region is adjacent a first of said sides and a portion of said drain region is adjacent a second of said sides, and wherein said insulator layer separates said portion of said source region from said first side and separates said portion of said drain region from said second side.

6. The structure of claim 5 wherein said source region comprises a lightly doped source region that is contiguous with said channel and adjacent to said first side of said gate electrode, and wherein said drain region comprises a lightly doped drain region that is contiguous with said channel region and adjacent to said second side of said gate electrode.

7. The structure according to claim 5 in which said portion of said source region and said portion of said drain region respectively have a greater volume than a portion of said source region and a portion of said drain region that are spaced from said channel region to self-create a lower concentration of dopant immediately adjacent said channel region.

8. A method for forming a transistor, comprising:

forming a gate electrode on a surface of a dielectric substrate;

forming a recess in said substrate such that said recess and said surface are contiguous at a boundary at which an end portion of said gate extends over said recess;

forming an insulator on exposed portions of said gate;

forming a layer of semiconductor material on said surface and in said recess such that said gate electrode overlays said semiconductor layer;

forming a channel region in said semiconductor material within said recess; and forming drain and source regions in said semiconductor material adjacent opposing ends of said channel to provide said transistor.

9. The method of claim 8 wherein said step of forming a gate electrode comprises:

depositing a film of polysilicon on said surface;

forming a mask layer over said film;

etching exposed portions of said film to form said gate electrode; and removing said mask layer.

10. The method of claim 8 wherein said step of forming a recess comprises:

forming after said gate electrode is formed, a mask layer that exposes said end portion of said gate electrode and an area of said substrate surface adjacent to said end portion; and isotropically etching said exposed substrate area so as to undercut said end portion of said gate electrode.

11. The method of claim 8 wherein said steps of forming a layer of semiconductor material and forming a channel region together comprise:

depositing a film of amorphous silicon on said surface of said substrate and in said recess;

forming a mask layer over said amorphous silicon;

anisotropically etching said silicon to leave a strip within said recess;

implanting with a dopant a portion of said strip remaining in said recess to form said channel;

removing said mask layer; and converting said strip to polysilicon.

12. The method of claim 8 wherein said step of forming said semiconductor layer includes:

forming a layer of silicon overlaying said gate electrode and in said recess overlaid by said gate electrode to provide some of said semiconductor layer above said gate electrode, some to the side of said gate electrode and some below said gate electrode.

13. The semiconductor structure of claim 1 wherein:

said gate electrode has a surface that is substantially parallel to said surface of said substrate and that faces away from said recess;

a portion of said insulator layer is disposed on said surface of said gate electrode; and a portion of said semiconductor layer is disposed on said portion of said insulator layer.

14. A method for forming a transistor, comprising:

forming on a surface of an insulator substrate a gate electrode having an end portion that has an end-portion surface contacting said substrate surface;

after said forming a gate electrode, forming in said substrate a recess that exposes said end-portion surface;

forming an insulator layer on said exposed end-portion surface;

forming a semiconductor layer on said surface of said substrate and in said recess; and forming in said semiconductor layer a drain and a source that are contiguous with first and second ends, respectively, of a channel.

15. The method of claim 14 wherein said forming a semiconductor layer comprises forming said semiconductor layer adjacent to multiple surfaces of said end portion of said gate electrode.

16. The method of claim 14 wherein said forming a gate electrode comprises:

depositing a film of polysilicon on said surface of said substrate;

forming a mask layer over said film;

etching exposed portions of said film to form said gate electrode; and removing said mask layer.

17. The method of claim 14 wherein said forming a recess comprises:

forming a mask layer that exposes said end portion of said gate electrode and an area of said substrate surface that is adjacent to said end portion; and isotropically etching said exposed area of said substrate surface to undercut said end portion of said gate electrode.

18. The method of claim 14 wherein said forming a semiconductor layer comprises:

depositing a film of amorphous silicon on said surface of said substrate and in said recess;

forming a mask layer on said film;

anisotropically etching said film to form a strip of amorphous silicon within said recess;

implanting with a dopant a portion of said strip to form said channel;

removing said mask layer; and converting said strip of amorphous silicon to polysilicon.

19. The method of claim 14, further comprising forming said channel in said semiconductor layer such that said channel is entirely within said recess and adjacent to said end-portion surface.

* * * * *